United States Patent [19]

Sherman

[11] Patent Number: 4,965,758

[45] Date of Patent: Oct. 23, 1990

[54] AIDING THE DESIGN OF AN OPERATION HAVING TIMING INTERACTIONS BY OPERATING A COMPUTER SYSTEM

[75] Inventor: Steven K. Sherman, Marlboro, Mass.

[73] Assignee: Digital Equipment Corporation, Maynard, Mass.

[21] Appl. No.: 162,624

[22] Filed: Mar. 1, 1988

[51] Int. Cl.$^5$ .............................................. G06F 15/60
[52] U.S. Cl. ...................................... 364/578; 371/23; 364/488
[58] Field of Search ............... 364/579, 580, 488, 578; 324/73 PC, 73 AT, 73 R; 371/25, 23

[56] References Cited

U.S. PATENT DOCUMENTS

| | | | |
|---|---|---|---|
| 4,651,284 | 3/1987 | Watanabe et al. | 364/491 |
| 4,725,971 | 2/1988 | Doshi et al. | 364/578 |
| 4,787,061 | 11/1988 | Nei et al. | 364/900 |
| 4,816,999 | 3/1989 | Berman et al. | 364/489 |

FOREIGN PATENT DOCUMENTS

| | | | |
|---|---|---|---|
| 2568698 | 2/1986 | France | 364/578 |
| 0703832 | 12/1979 | U.S.S.R. | 364/578 |
| 1012267 | 4/1983 | U.S.S.R. | 364/578 |
| 1119024 | 10/1984 | U.S.S.R. | 364/578 |
| 1124318 | 11/1984 | U.S.S.R. | 364/578 |
| 1129617 | 12/1984 | U.S.S.R. | 364/578 |

OTHER PUBLICATIONS

"The Theory of Switching Nets", M. Yoeli, Special Supplement to IRE Transaction, May, 1959, pp. 152–157, Int'l. Symp. on Circuit Inform. Theory.
"§8.3 Weighted Digraphs", pp. 344–351, Ross & Wright, Discrete Mathematics, 2nd Ed. Prentice Hall, 1988.
"Verifying Compiled Silicon", Edmund K. Cheng, VLSI Design, Oct., 1984, pp. 2–4.
"Silicon Compiler Lets System Makers Design Their Own VLSI Chips", Stephen Johnson and Stan Mazor, Silicon Compilers Reprint, Article Reprinted from Electronic Design, Oct. 4, 1984.

Primary Examiner—Parshotam S. Lall
Assistant Examiner—S. A. Melnick
Attorney, Agent, or Firm—Kenyon & Kenyon

[57] ABSTRACT

An aid for design analysis of timing requirements of a computer operation by operating a computer system and identifying an optimized reduced set of requirements which is self consistent and which is minimally reduced from the original.

7 Claims, 8 Drawing Sheets

AIDING THE DESIGN OF AN OPERATION HAVING TIMING INTERACTIONS BY OPERATING A COMPUTER SYSTEM

BRIEF SUMMARY OF THE INVENTION

This invention relates to the design of complex operations such as those encountered in developing computers, and more particularly to assisting in the resolution of timing problems in such designs.

The design of a complex operation such as a read operation of a computer involves a number of interrelated timing specifications—200 specifications might be considered typical. Some of these specifications arise from hardware limitations such as requiring that a stable input signal to a device be established for a certain minimum time interval before a stable output signal is achieved; others arise from system requirements such as design cycle or operation time. Especially as such specifications relating to an operation become more numerous, it can be very difficult for a designer by inspection or analysis to tell whether a given aggregate of specifications is internally consistent, and if not where the trouble is. Frequently timing problems have been worked out only by simulation of the operation or by building and exercising a prototype, both rather expensive procedures.

The present invention describes method and apparatus for analysis of timing requirements by identifying an optimized reduced set of requirements which is self consistent and which is minimally reduced from the original.

DETAILED DESCRIPTION

Figure 1:
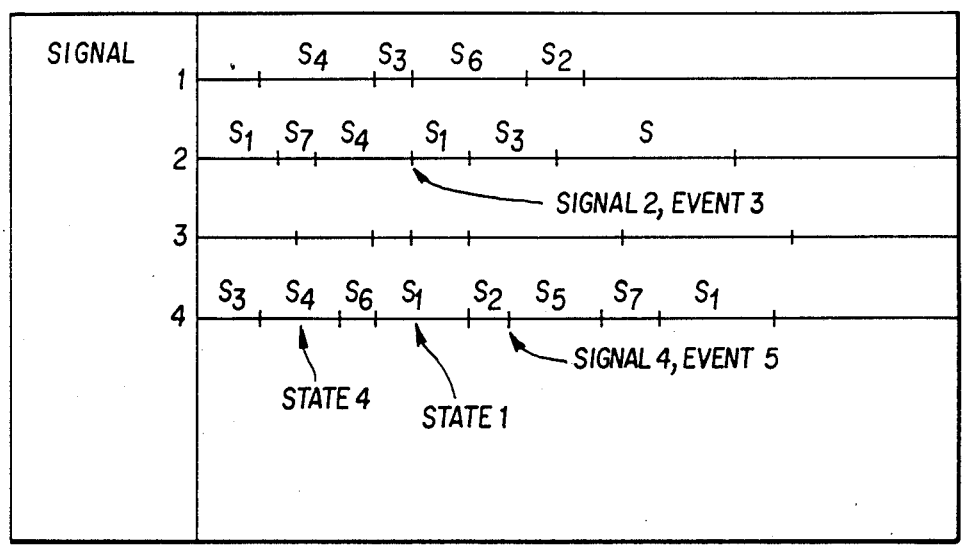
FIG. 1 shows an archetypal sequence pattern such as may be used to define dependences used in the invention.

It is a frequent practice in analyzing the timing of computer operations to define a sequence pattern giving a sequence of states for each of several electrical points of the hardware system. The sequence pattern of an operation provides a suitable framework for a systematic description of its timing requirements. The particular set of states recognized in the analysis may include, in addition to the high voltage and low voltage states used for data signals, states indicating the electrical point is indeterminate or in some transition, but the particular set of states is not relevant to the present invention. The sequence for a particular electrical point may be denominated the signal of the electrical point, and a signal will thus be a sequence of states with each boundary between succeeding states denominated an event. The aggregate of the signals may be denominated a sequence pattern. When a sequence pattern is presented against a time base common to all signals it is denominated a timing pattern. Each event of a sequence pattern can be identified by giving the name of its signal and its ordinality: Signal 3, 4th event. An archetypal sequence pattern is shown in FIG. 1.

According to the invention, the timing requirements of an operation are expressed with reference to a sequence pattern as a set of dependences. Each dependence has a name, identifies a first event and a second event, specifies a time interval between first and second events (which may have a negative as well as a positive value), specifies a type for the dependence, and specifies a class for the dependence. The dependence type may be either "max" or "min" and characterizes whether the interval specified between the identified events is a maximum or a minimum requirement. The dependence class may be either primary or secondary and characterizes two levels of importance for the specification as determined by the analyst. An event which is identified in a dependence of primary class will be designated a primary event; an event not so identified will be designated a secondary event. It may be particularly noted that each dependence involves only one time value. If it is desired to incorporate a timing requirement of the form that some value lies between a lower and an upper bound, it is necessary to express this requirement as two distinct dependences—a max type and a min type.

Figure 2:
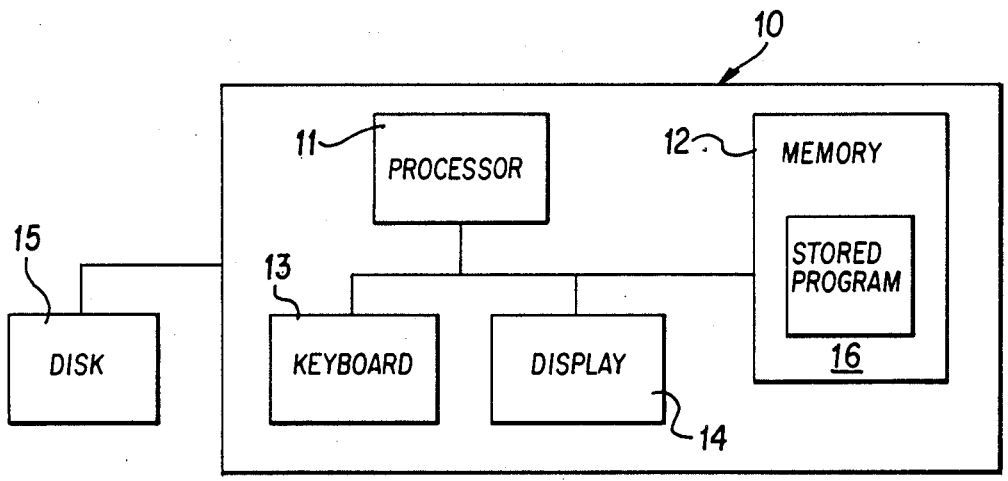
FIG. 2 shows a computer such as may be used to practice the invention.
Figure 3:
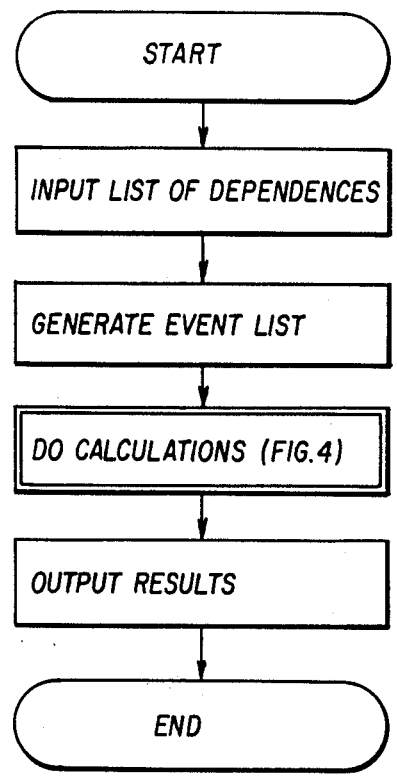
FIGS. 3-8 show the flow diagram of a program according to the invention.
Figure 4:
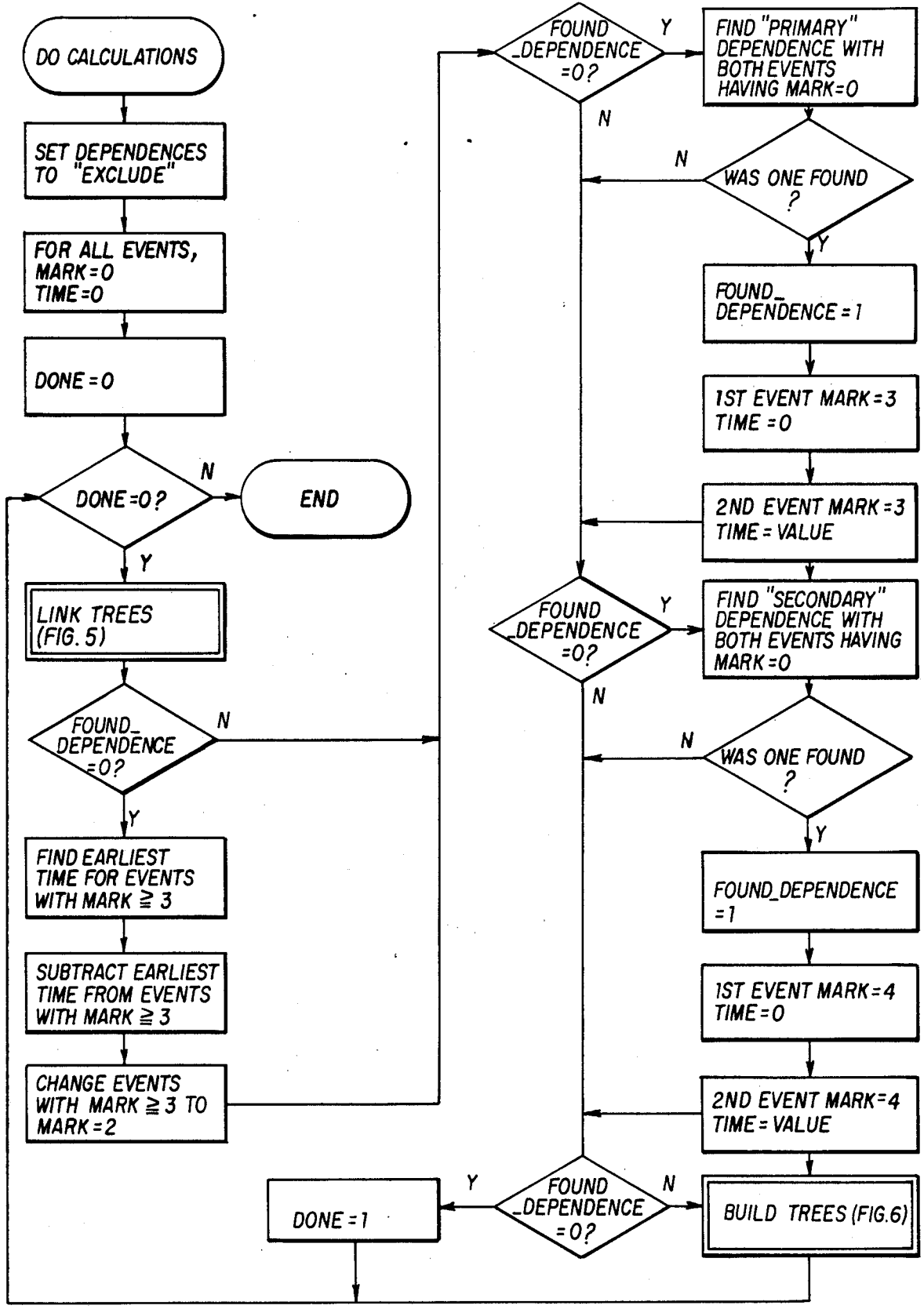
Figure 5:
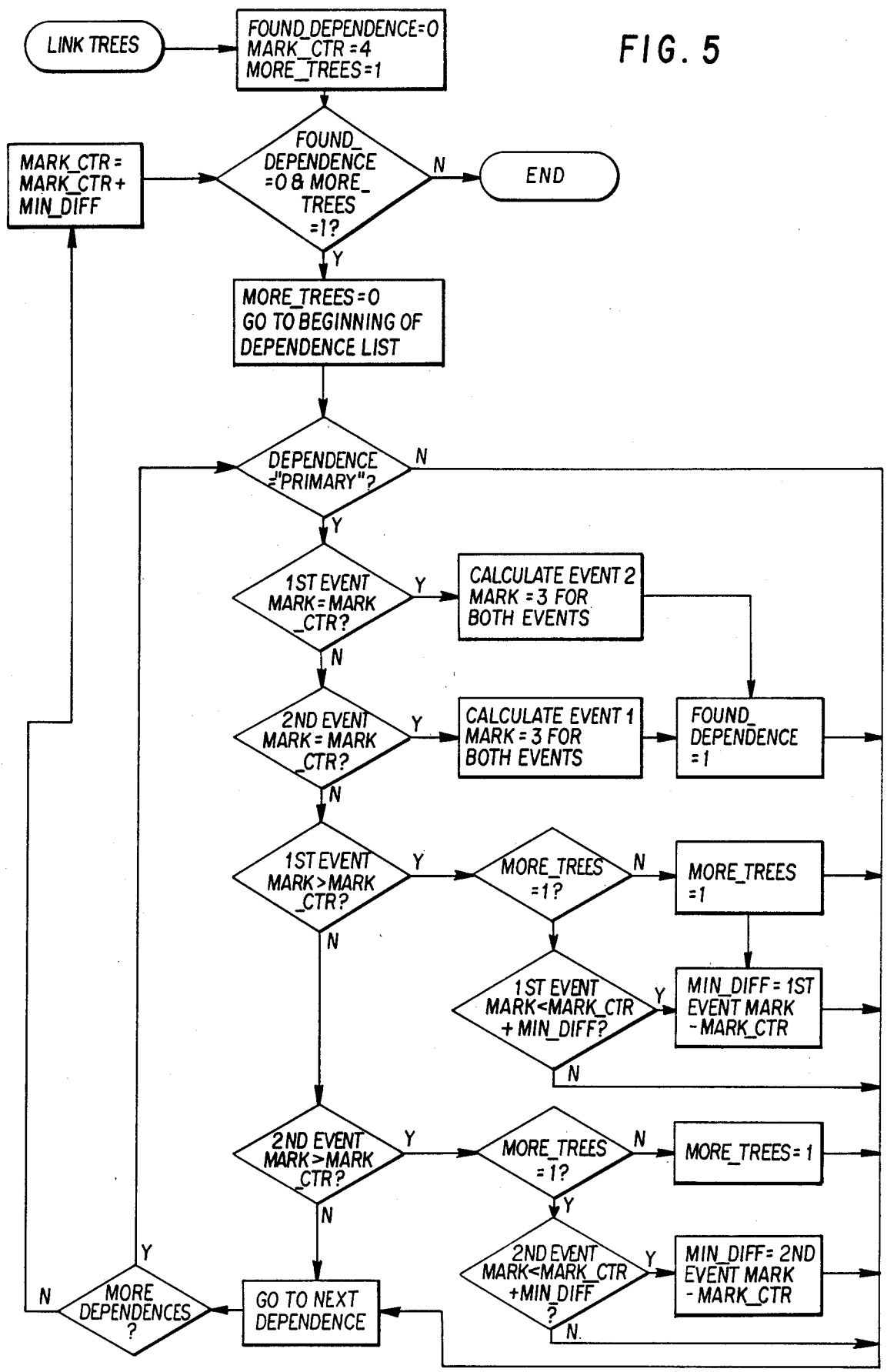
Figure 6:
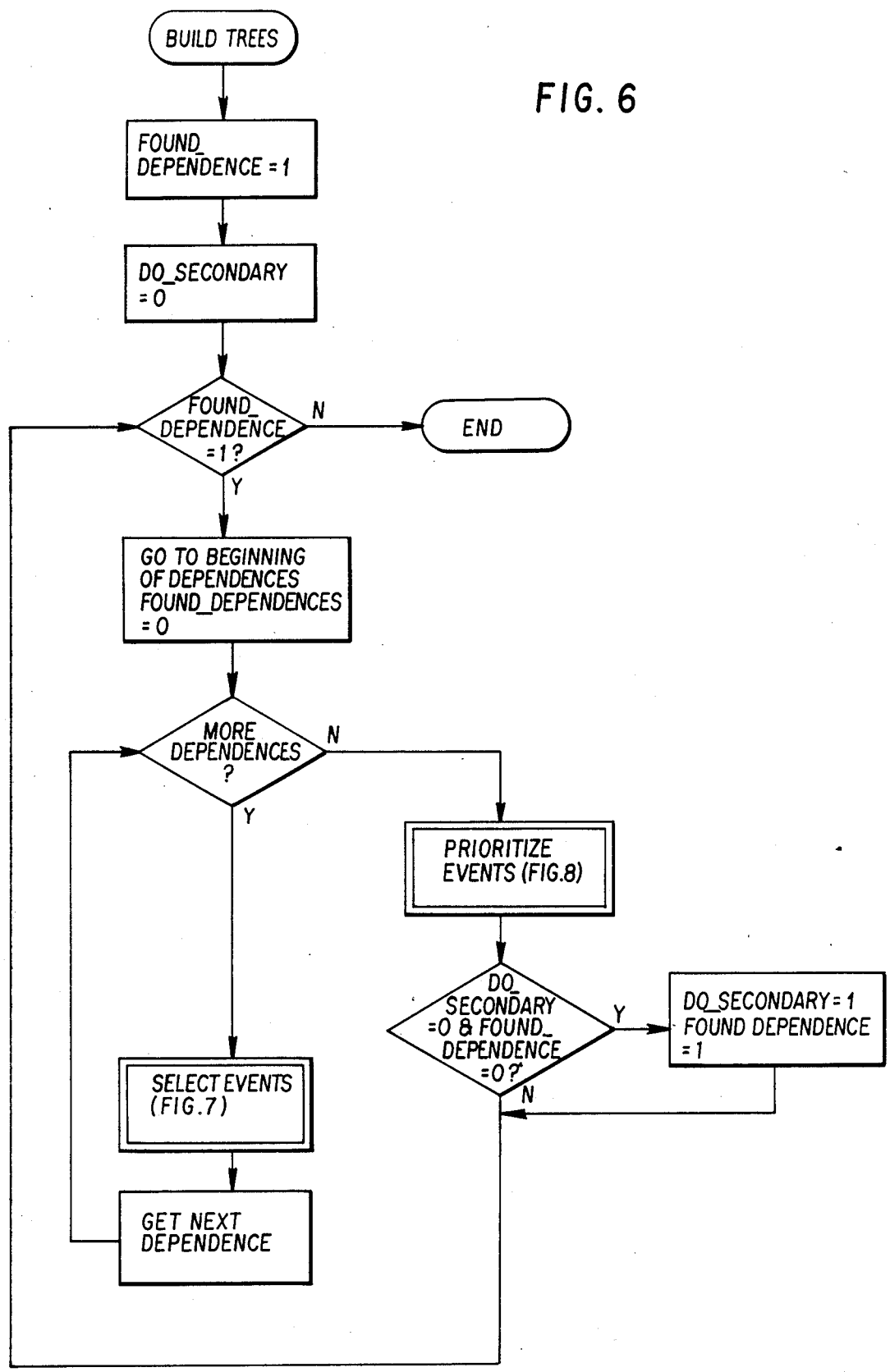
Figure 7:
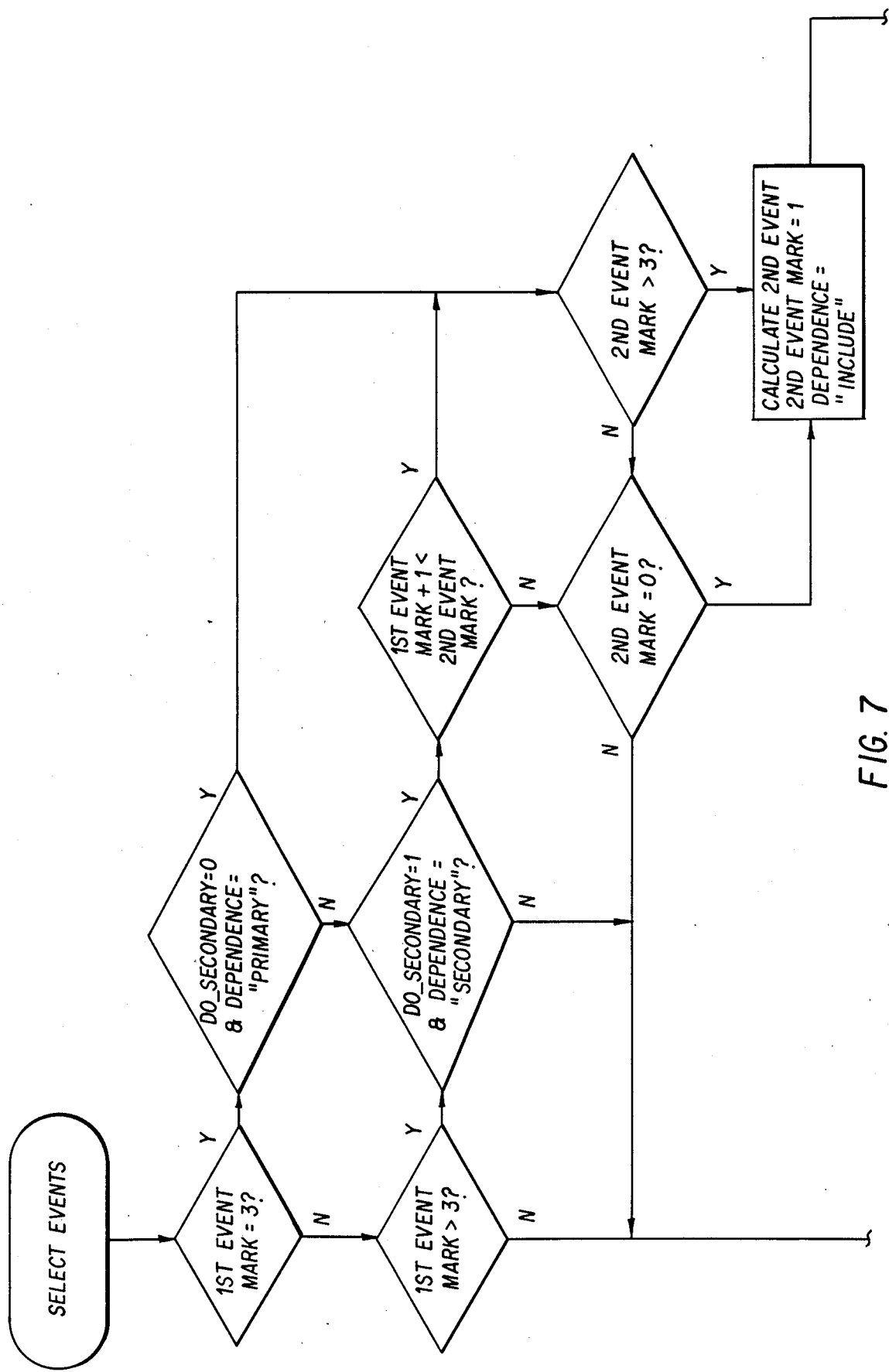
Figure 7:
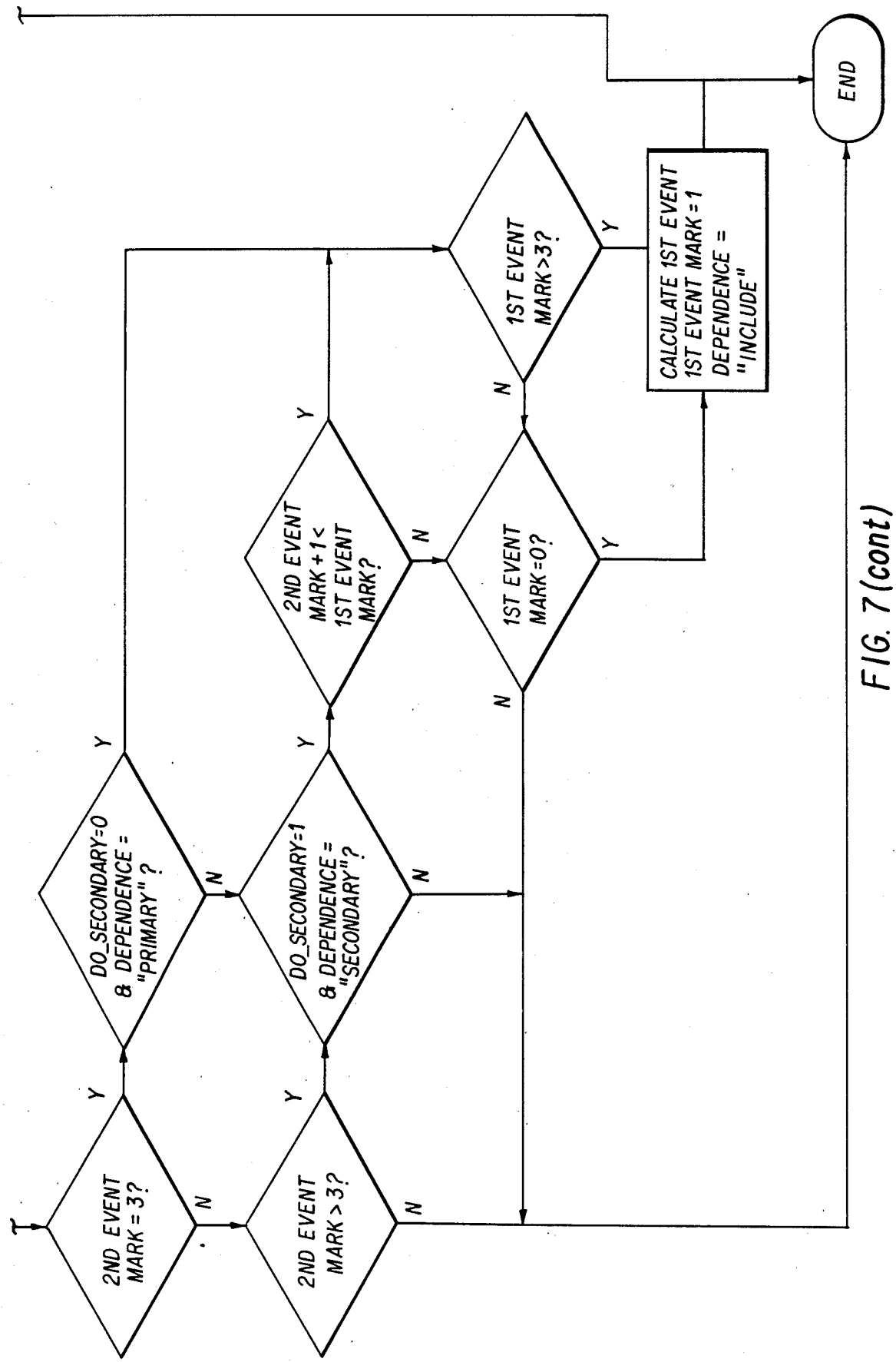
Figure 8:
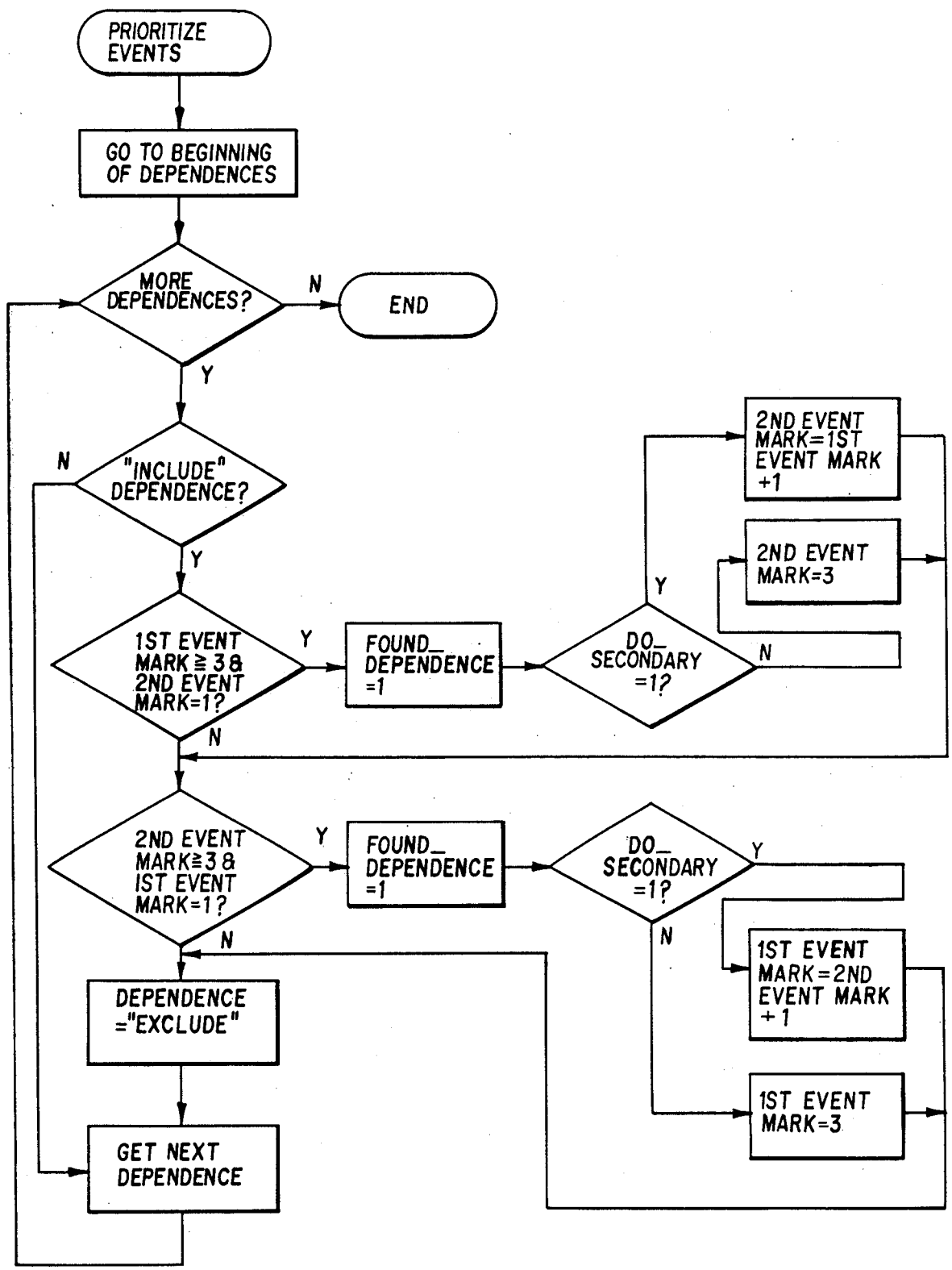

The invention is conveniently practised using a computer as shown in FIG. 2. Computer 10 includes processor 11, memory 12, entering means, such as keyboard 13, for entering data into the computer, and outputting means, such as display 14, for outputting data from the computer. Processor 11, memory 12, keyboard 13, and display 14 are constructed and interconnected as well known in the art. Disk 15 may provide alternative means for entering and outputting data. A program 16 stored in memory 12 provides with processor 11 calculating means for calculating certain data as will further described hereafter.

In practicing the invention, one first expresses the timing requirements of an operation as a set of dependences and enters them into a dependence file in the memory 12 of computer 10. The dependences may be entered directly through keyboard 13, but it is usually more convenient to formulate the dependences and represent them in a dependence file on a disk and then enter the dependence file into the computer memory from the disk. Output reports may also be specified at the outset and represented on the disk. An advantageous format for expressing and entering the dependences is tSPEC,min,+13,signal 2-5,signal 22-14, secondary where tSPEC is the name of the dependence; signal 12-5 identifies the first dependence event as the 5th event of the 12th signal; signal 22-14 identifies the second dependence event as the 14th event of the 22nd signal; +13 indicates a time interval of 13 units of time between these events; min indicates that the time interval specified is a minimum (the alternative would be max for maximum); and secondary indicates that the dependence is of secondary importance (the alternative would be primary).

After the dependences have been entered a series of calculations are made by the computer under control of the stored program. Before considering in detail the operation of this program it will be useful to consider the objective and results of the calculations.

The computations made according to the invention can be conveniently explained by reference to the terminology of mathematical graphs. A graph in this sense is a set of vertexes connected by a set of edges. It is readily seen that a set of dependences as described above is isomorphic with such a graph: the events identified in the dependences corresponding to vertexes of the graph, and the association of events specified by a dependence corresponding to edges of the graph. An arbitrary set of dependences may correspond to a plurality of disconnected graphs. This means, however, that there is no relationship specified by a dependence between the events of one graph to those of another. Initially we consider a subset D of dependences which are related and which are isomorphic to a single connected graph G.

A further aspect of the isomorphism of the set of dependences and the graph is that to every internal inconsistency of the set of dependences there will be a reentrant path (or loop) in the graph. This can be readily seen by considering that an inconsistency means that there are alternative linkages (or paths in graph terminology) through the dependences between two events, and these two linkages imply disparate time relationships between the two events. Two alternative paths may however imply the same time relationship so that such loops in the graph (denominated zero loops) do not imply an inconsistency in the dependences.

The result of the operation of the program is to define a new graph T which has vertexes which are the same as those of the graph G and which has edges which correspond to a subset I of the dependences in D, and which has a time attribute associated with each of its vertexes. The dependences included in I (the included dependences) are chosen to meet the conditions:

(1) the number of primary class dependences from the set D included in I be maximized, (2) all primary vertexes be connected by a set C of core linkage dependences, set C being a subset of I, the number of secondary dependences in the core linkage set C being minimized, (3) each secondary vertex $S_i$ be connected to a primary vertex by a set $P_i$ of peripheral-linkage secondary dependences, set $P_i$ being a subset of I, the number of secondary dependences in each peripheral-linkage set $P_i$ being minimized, and (4) subject to the above enumerated conditions, the number of secondary class dependences in I be maximized.

The result of the computation process is to define a set of dependences which is a subset of the original set and is free of inconsistencies. The subset is also optimized in the sense that the dependences of the original set that are omitted are those least directly linked with the core of primary dependences.

The steps of the computational operation are diagrammed in FIGS. 3–8. As shown particularly in FIG. 3, the initial step is the inputting of the set of dependences. The data structure for this list includes fields for: Name; Type; Time interval; First event; Second event; Class; Used-flag; Include-flag. The first six fields have been discussed earlier; the two flag fields are used to keep track of the progress of the operations.

After the inputting of the dependences, the program generates an event list from the dependence list. The data structure for the event list includes fields for: Signal name; Event number; Time attribute; Mark. Of these, the signal name and event number are directly derived from the dependence list. The time attribute is calculated in the course of the program operation. The mark parameter is used to indicate the status of the calculation of the event. It may have values as follows: 0=uncalculated; 1=to be calculated; 2=adjusted; 3=calculated with primary dependence; 4 and higher=path distance to primary event. After generating the dependence lists, the program goes to the "do calculations" diagrammed in FIGS. 4–8.

After an initial pass through the "link trees" module, the program finds a primary dependence (FIG. 4, upper right) which serves as a root dependence of a tree. The list of dependences is repeatedly searched and additional dependences are then found and attached to expand the tree. As new events are added, their time attributes are calculated so as to be consistent with the interval specified in the dependence.

Dependences and events are added in layers around the initial root dependence. (The layers are tracked with the "mark" flag.) First (with successive passes around "build trees") the program connects additional primary dependences to form a primary event nucleus. Then (with successive passes around "build trees") secondary dependences are added in layers around the primary event nucleus. When this process has been exhausted, the program moves to "link trees" and finds all primary dependences attaching to the layer of the then constructed tree which is innermost and which has a vertex associated with an unattached primary dependence. These newly attached primaries serve as secondary roots. The program reverts to "build trees" and builds on the secondary roots in the same fashion as it did on the original root: first adding primaries to form nuclei and then secondaries in layers. When this processes is exhausted the program reenters and repeats "link trees". And so on until all dependences have been connected.

Certain features of the calculation deserve notice. When a dependence is processed which attaches a previously unattached event (or vertex, in graph terminology), the new vertex is assigned a time consistent with the dependence. Such a dependence will therefore meet the definition of an included dependence.

The organization of the search for secondary roots by examining layers progressively outward on the then existing tree assures that the primary vertexes will be connected through a minimum set C of core linkage dependences.

When a secondary dependence is processed which bridges two already connected vertexes this indicates that a loop is being completed. Neither vertex is reassigned a time, and unless the loop completed is a zero loop, the newly processed dependence will not have an interval consistent with the time values assigned to its vertexes. Such a dependence does not then qualify as an included dependence in set I. The order of processing, in which secondary dependences are added in layers around a nucleus of primary dependences ensures that the non-included secondary dependences of a loop involving a single nucleus will be as far as possible from the primary dependences. Loops involving a plurality of nuclei will initially produce a non-included secondary dependence abutting the point where a growing nucleus impinges on an already attached vertex. In subsequent passes through "select events", however, the times assigned to vertexes is revised to make the non-included dependence the one most distant from a primary dependence. Together these arrangements of the order of processing assure that every secondary vertex is connected to a primary vertex by a minimum path of peripheral-linkage secondary dependences.

After the completion of the computations described above, a time consistent graph T will have been constructed related to the original dependence set and with the properties as discussed above.

In the preceding discussion it has been supposed that all the dependences were related, that is to say connected in a single graph. If, however, there are additional sets in the entered dependences unconnected to the graph first processed by the program, these will be started (using the program portion at the right of FIG. 4) after completing the original tree and processed in the same manner to produce trees with the same properties.

The next step according to the invention is to output information that is useful in the design of the computer operation which has motivated the calculation. The designer can address individual and specific inquiries through the keyboard or use program modules to generate systematic reports. The techniques for implementing such outputting of information are well known and need no explication here. It will be worth while, however, to point to some outputs which are particularly useful.

Probably the output information of preeminent interest to a designer is a list of the non-included dependences, these being those from the originally entered set D which are not included in the set I. In particular, if this list is empty it means that the originally entered set of dependences are consistent. If the list is not empty it identifies the inconsistencies and promising dependences for revision. Whether non-included dependences are violated or not may also be usefully reported. A violated dependence is one of type max for which the interval implied from the graph T is greater than that specified or one of type min for which the implied interval is less than that specified.

When signal sequence data has been inputted, a report of a timing pattern may be obtained in which events of various signals are displayed against a common time base.

When signal sequence data has been inputted, a report of out of sequence events may be obtained.

A report may be obtained of the interval between specified events which are not included dependences.

A timing pattern may be inputted and a report output of discrepancies with the timing pattern implied by the graph T.

What is claimed is:

1. A method to aid in the design of an operation having timing interactions, by operating a computer system including a processor, a memory, a means for entering data and a display, the method comprising the steps of:
   (a) generating with said processor a dependence list data structure from a set D of dependence information entered into the memory, the dependence information describing timing relationships between first and second events of each dependence of the operation and describing each dependence as a primary dependence or secondary dependence;
   (b) generating an event list data structure in the memory from the dependence list data structure, said events identified in one or more of said primary class dependences being primary events and said events identified in no primary class dependence being secondary events, said set D including related dependences which are isomorphic with a single graph G having edges connecting vertexes, the vertexes of G corresponding to events named in the events list data structure and the edges of G corresponding to the dependences in the dependence list data structure;
   (c) searching the dependence list and locating a first primary dependence to serve as a root dependence for a tree;
   (d) forming a primary event nucleus by selecting and attaching additional primary dependences to said tree;
   (e) adding secondary dependences in layers around the primary event nucleus of said tree;
   (f) assigning a time attribute to events in said tree, said time attributes being consistent with the timing relationships specified in the set D of dependence information;
   (g) repeating steps (d), (e) and (f) to develop a time consistent graph T having all the vertexes of graph G and with edges corresponding to dependences in a set I of included dependences, I being a subset of G, a dependence being in I if its interval corresponds to the difference in time attributes of its two vertexes, the set I of included dependences and the time attributes being subject to the conditions that:
     (1) the number of primary class dependences from the set D included in I be maximized;
     (2) all primary vertexes be connected by a set C of core linkage dependences, set C being a subset of I, the number of secondary dependences in the core linkage set C being minimized;
     (3) each secondary vertex $S_i$ be connected to a primary vertex by a set $P_i$ of peripheral-linkage secondary dependences, set $P_i$ being a subset of I, the number of secondary dependences in each peripheral-linkage set $P_i$ being minimized;
     (4) subject to the above conditions in (1), (2) and (3), the number of secondary class dependences in I be maximized;
   (h) providing design information from the time consistent graph T on the display means; and
   (i) applying the design information to aid in the design of said operation.

2. A method as claimed in claim 1, wherein said providing step includes reporting those dependences in set D which are not in set I.

3. A method as claimed in claim 2, wherein said generating step includes entering data characterizing dependence intervals as maximum or minimum, and wherein said providing step includes reporting whether those dependences in set D which are not in set I are violated.

4. A method as claimed in claim 1, wherein said generating step includes entering signal sequence data about said operation, and wherein said providing step includes reporting a timing pattern based on the graph T.

5. A method as claimed in claim 1, wherein said generating step includes entering signal sequence data about said operation, and wherein said providing step includes reporting events sequenced differently in graph T than in the entered signal sequence data.

6. A method as claimed in claim 1, wherein said generating step includes entering data defining a query as to time interval between two events and wherein said providing step includes reporting such time interval as indicated by the graph T.

7. A method as claimed in claim 1, wherein said generating step includes entering data defining a timing pattern, and wherein said providing step includes reporting discrepancies between said timing pattern and a timing pattern implied by the graph T.

* * * * *